United States Patent
Ibrahim et al.

(10) Patent No.: US 10,671,109 B2
(45) Date of Patent: Jun. 2, 2020

(54) SCALABLE LOW OUTPUT IMPEDANCE BANDGAP REFERENCE WITH CURRENT DRIVE CAPABILITY AND HIGH-ORDER TEMPERATURE CURVATURE COMPENSATION

(71) Applicant: Vidatronic Inc., College Station, TX (US)

(72) Inventors: Sameh Assem Ibrahim, Cairo (EG); Anand Veeravalli Raghupathy, Plano, TX (US); Mostafa Mohamed Hesham Kamel Toubar, Cairo (EG); Moises Emanuel Robinson, College Station, TX (US)

(73) Assignee: Vidatronic Inc., College Station, TX (US)

( * ) Notice: Subject to any disclaimer, the term of this patent is extended or adjusted under 35 U.S.C. 154(b) by 0 days.

(21) Appl. No.: 16/020,983

(22) Filed: Jun. 27, 2018

(65) Prior Publication Data

US 2020/0125129 A1 Apr. 23, 2020

(51) Int. Cl.
*G05F 3/30* (2006.01)
*G05F 3/22* (2006.01)

(52) U.S. Cl.
CPC ............... *G05F 3/30* (2013.01); *G05F 3/225* (2013.01)

(58) Field of Classification Search
None
See application file for complete search history.

(56) References Cited

U.S. PATENT DOCUMENTS

| | | | | |
|---|---|---|---|---|
| 6,016,051 A | * | 1/2000 | Can | G05F 3/30 323/314 |
| 6,232,828 B1 | * | 5/2001 | Smith | G05F 3/30 323/313 |
| 6,384,586 B1 | * | 5/2002 | Sugawara | G05F 3/225 323/313 |
| 7,579,822 B1 | * | 8/2009 | Sutardja | G05F 3/30 323/313 |
| 7,705,662 B2 | * | 4/2010 | Ng | G05F 3/30 327/513 |
| 8,390,363 B2 | * | 3/2013 | Engl | G05F 3/30 327/138 |
| 9,582,021 B1 | * | 2/2017 | Arnold | G05F 3/16 |
| 2007/0046363 A1 | * | 3/2007 | Tanzawa | G05F 3/30 327/539 |
| 2008/0180070 A1 | * | 7/2008 | Kushima | G05F 3/30 323/233 |
| 2010/0073070 A1 | * | 3/2010 | Ng | G05F 3/30 327/513 |
| 2014/0266139 A1 | * | 9/2014 | Eberlein | G05F 3/16 323/313 |

\* cited by examiner

*Primary Examiner* — Cassandra F Cox
(74) *Attorney, Agent, or Firm* — Liang Legal Group, PLLC

(57) ABSTRACT

A bandgap reference circuit includes a circuit for high-order temperature curvature compensation; and a circuit for low output impedance and current drive capability, wherein an output voltage of the bandgap reference circuit can be independently adjusted to be either above or below a silicon bandgap voltage without impacting temperature curvature.

12 Claims, 5 Drawing Sheets

SCALABLE LOW OUTPUT IMPEDANCE BANDGAP REFERENCE WITH CURRENT DRIVE CAPABILITY AND HIGH-ORDER TEMPERATURE CURVATURE COMPENSATION

BACKGROUND

A bandgap reference circuit is an important module for most electronic circuits and systems. Such circuit may provide reference voltages and/or reference currents that must be independent of process, supply and temperature. In some cases, the reference currents may be inversely proportional to the value of a reference resistor.

Conventional bandgap reference circuits provide reference voltages and/or reference currents with temperature variations that are inadequate for high-precision applications. As a result, high-order temperature curvature compensation circuits are added to solve this issue.

Conventional bandgap reference circuits that provide a voltage reference are referred to as bandgap voltage reference circuits. Typically, no load currents are required from the output of a bandgap voltage reference circuit. As a result, a high impedance at the output of the bandgap voltage reference circuit is acceptable. In contrast, a low output impedance is needed when high load currents or high leakage currents are present at the output; otherwise, the output reference voltage will vary as a function of the output load current. This can be solved by using an error amplifier output as the bandgap reference circuit output. While this is possible for a traditional bandgap reference circuit, the output voltage of which is equal to (or near) the silicon bandgap voltage (1.22 V at 0K), it is not easy for a scalable bandgap reference circuit, the output voltage of which can be of any value above or below the silicon bandgap voltage, irrespective of the silicon bandgap voltage. High-precision applications that need load or leakage currents from a scalable bandgap reference circuit require both high-order temperature curvature compensation and low output impedance. The silicon bandgap voltage is a reference voltage commonly used in the art. This may be referred to as a "golden voltage" in this description.

FIG. 1 shows a prior art bandgap voltage reference circuit, wherein the output reference voltage is $V_{REF}$. The circuit comprises a conventional bandgap voltage reference circuit made of the two bipolar junction transistors $Q_1$ (101) and $Q_2$ (102), the three resistors $R_1$ (103) and $R_2$ (i.e., (104) and (105)), an operational amplifier (106), the MOSFET current sources $M_1$ (107) and $M_2$ (108), and the output branch made of the MOSFET current source $M_3$ (109) and resistor $R_3$ (110). The currents flowing in the bipolar transistors $Q_1$ (101) and $Q_2$ (102) are proportional to the absolute temperature (PTAT), while the currents flowing in the resistors $R_2$ (e.g. (104) and (105)) are complementary to the absolute temperature (CTAT). As a result, the currents in the MOSFET current sources $M_1$ (107), $M_2$ (108) and $M_3$ (109) are almost independent of the absolute temperature. However, due to the non-linear temperature dependence of the CTAT currents originating from the bipolar junction forward voltage, the reference voltage $V_{REF}$ shows temperature dependence that is usually not acceptable in high-precision applications. The circuit uses the bipolar junction transistor $Q_3$ (111), the resistors $R_{NL}$ (i.e. (112) and (113)), and the MOSFET current source $M_4$ (114) to subtract the non-linear temperature dependence of the CTAT currents to yield an almost constant reference with respect to temperature variations.

FIG. 2 shows a prior art bandgap voltage reference circuit where the output reference voltage is $V_{REF}$. The circuit comprises a conventional bandgap voltage reference circuit made of the two bipolar junction transistors $Q_1$ (201) and $Q_2$ (202), the three resistors $R_1$ (203), and $R_2$ (i.e., (204) and (205)), an operational amplifier with low output impedance (206), and a transconductance amplifier (207). With the voltage reference $V_{REF}$ being the output of the operational amplifier, a low output impedance can be guaranteed at the output of the bandgap reference circuit. Accordingly, it can provide an output current or support a high leakage current. The transconductance amplifier must have a linear relationship between its input voltage and output current that has very small dependence on temperature.

FIG. 1 and FIG. 2 discuss prior art bandgap voltage reference circuits, where either high-order temperature curvature compensation or low output impedance is used, but not both. Such bandgap voltage reference circuits cannot be used in high-precision applications when the bandgap voltage reference circuit needs to support a load or leakage output current.

SUMMARY

In general, in one aspect, the invention relates to a novel architecture to provide high-order temperature compensation in addition to a low output impedance for a bandgap voltage reference circuit, making it suitable for high-precision applications that require an output current from the bandgap voltage reference circuit. As known in the art, "high-order temperature compensation" refers to temperature compensation beyond the first-order compensation, i.e., second-order and/or higher-order compensation. As used herein, the term "low output impedance" refers to in a range of hundreds to a few kiloohms (e.g., $10^2\Omega$<impedance<$10^4\Omega$), preferably $2\times10^2\Omega$<impedance<$5\times10^3\Omega$, and more preferably $5\times10^2\Omega$<impedance<$2\times10^3\Omega$.

One aspect of the invention relates to bandgap reference circuits. A bandgap reference circuit in accordance with one embodiment of the invention comprises a circuit for high-order temperature curvature compensation; and a circuit for low output impedance and current drive capability, wherein an output voltage of the bandgap reference circuit can be independently adjusted to be either above or below a silicon bandgap voltage without impacting temperature curvature.

In accordance with embodiments of the invention, a bandgap reference circuit comprises a conventional bandgap circuit comprises two bipolar junction transistors and three resistors having a first input, a second input, and a first output connected to ground; an operational amplifier having a third input connected to the first input of the conventional bandgap circuit, a fourth input connected to the second input of the conventional bandgap circuit, and a second output; a buffer circuit having a fifth input connected to the second output of the operational amplifier, and a third output; a temperature curvature compensation circuit comprising a third bipolar junction transistor and two resistors having a sixth input connected to the first input of the conventional bandgap circuit, a seventh input connected to the second input of the conventional bandgap circuit, an eighth input, and a fourth output connected to ground; and a transconductance amplifier having a ninth input connected to the third output of the operational amplifier, a tenth input connected to ground, a fifth output connected to the first input of the conventional bandgap circuit, a sixth output connected to the second input of the conventional bandgap amplifier, and a seventh output connected to the eighth input of the temperature compensation circuit. The operational amplifier may be implemented as a single or two-stage amplifier, a folded-cascode, or a telescope cascode amplifier. The operational amplifier may be implemented with degeneration resistors in current sources to reduce an input-referred offset voltage. The operational amplifier may have an input pair comprising an NMOS transistor, a PMOS transistor, an npn transistor, a pnp transistor, a FinFET transistor, or a combination thereof. The two bipolar junction transistors may comprise an npn or a pnp transistor. The resistors comprise a silicided poly resistor, an unsilicided poly resistor, a diffusion resistor, a well resistor or a combination thereof. The conventional bandgap circuit may be directly connected to the operational amplifier or through a resistor divider, wherein one end of the resistor divider is connected to ground and one end is connected to the conventional bandgap circuit output, wherein an output of the resistor divider is connected to the operational amplifier input. The transconductance amplifier may convert a reference voltage to three separate currents. The transconductance amplifier can be implemented with degeneration resistors in current sources to reduce an input-referred offset voltage. The buffer can be implemented as a native NMOS transistor, wherein a gate of the NMOS transistor is connected to the output of the operational amplifier.

Other aspect of the invention would be apparent with the following detailed description and the accompanying drawings.

BRIEF DESCRIPTION OF DRAWINGS

The appended drawings illustrate several embodiments of the invention and are not to be considered limiting of its scope, for the invention may admit to other equally effective embodiments.

DETAILED DESCRIPTION

Figure 1:
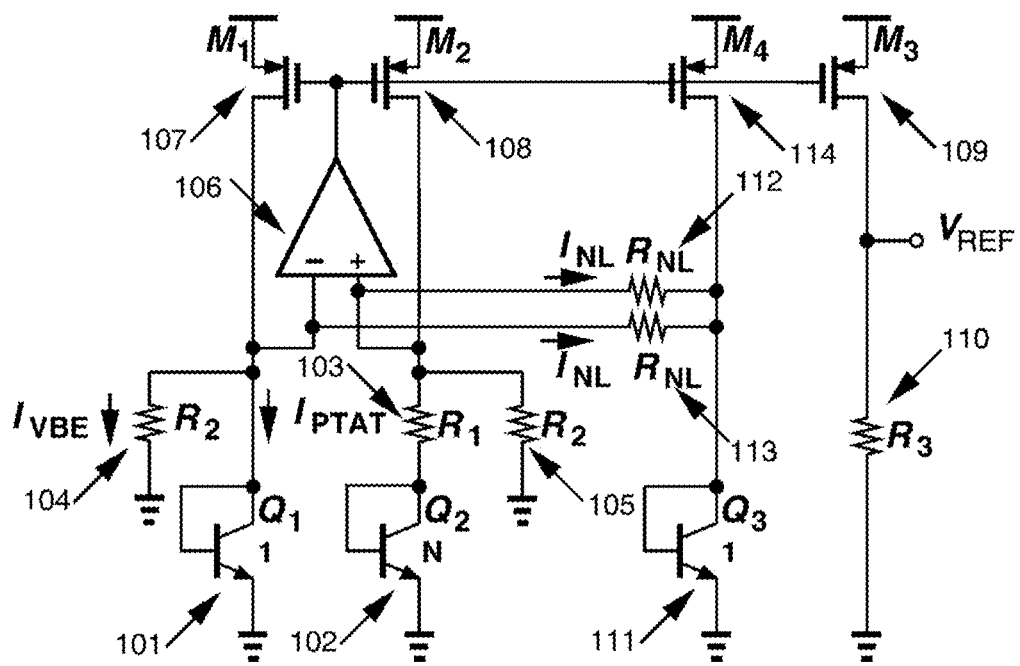
FIG. 1 shows a schematic block level circuit diagram of a prior art bandgap voltage reference circuit with high-order temperature curvature compensation.
Figure 2:
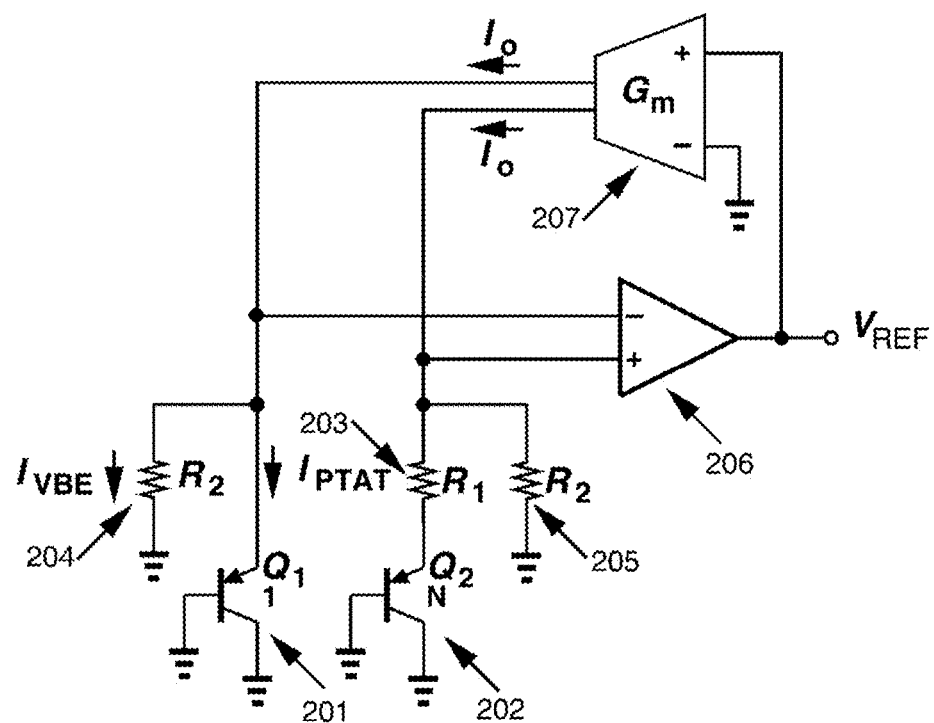
FIG. 2 shows a schematic block level circuit diagram of a prior art bandgap voltage reference circuit with low output impedance.

Aspects of the present disclosure are shown in the above-identified drawings and are described below. In the description, like or identical reference numerals are used to identify common or similar elements. The drawings are not necessarily to scale, and certain features may be shown exaggerated in scale or in schematic in the interest of clarity and conciseness.

Embodiments of the invention relate to a bandgap voltage reference circuit with high-order temperature curvature compensation and low output impedance. In one or more embodiments of the invention, a transconductance amplifier is used to provide three currents with low dependence on temperature to improve the temperature dependency of the output voltage. In one or more embodiments of the invention, an operational amplifier with a low output impedance is used to reduce the overall output impedance of the bandgap voltage reference circuit and allow supporting load or leakage currents via the reference output voltage. Without embodiments of the invention, a bandgap voltage reference circuit cannot provide an output reference voltage that remains constant in the presence of both temperature variations and load or leakage currents taken from the reference output voltage. Those skilled in the art, with the benefit of this disclosure will appreciate that same or similar features are equally applicable to any system whose operation requires high-precision and low output impedance.

In one or more embodiments, the bandgap voltage reference circuit can be implemented on a microchip, such as a semiconductor integrated circuit or can be implemented out of discrete components. In one or more embodiments, the bandgap reference circuit can optionally use an output capacitor. Throughout this disclosure, the terms "bandgap circuit," "bandgap reference circuit," "bandgap voltage reference circuit," and "voltage reference" may be used interchangeably depending on the context.

Figure 3:
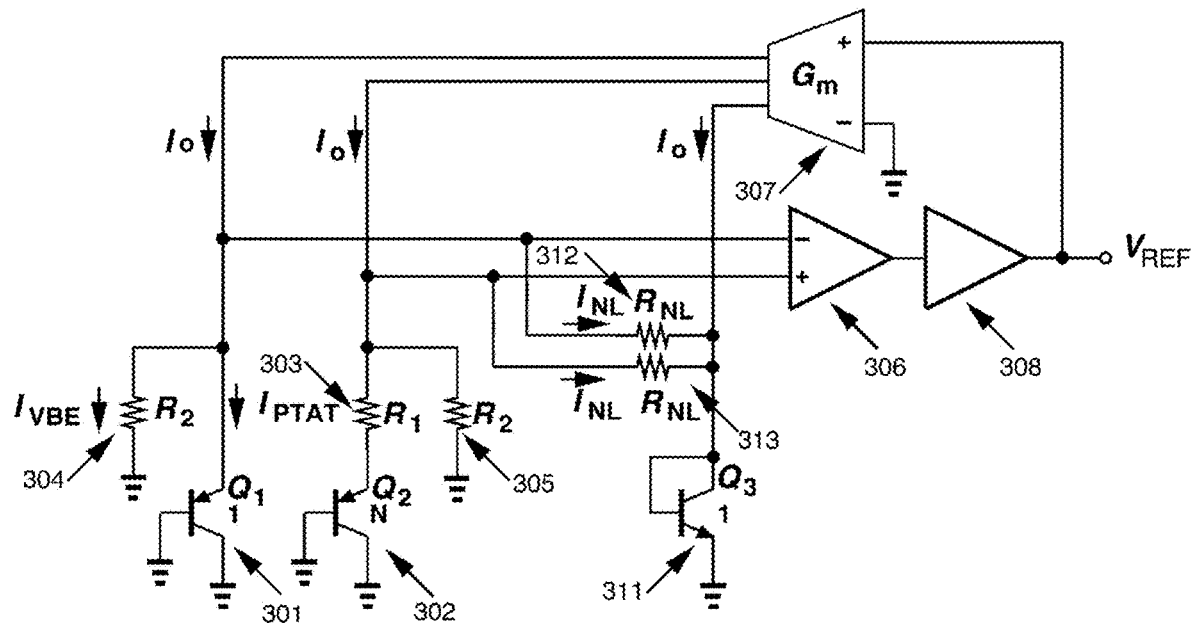
FIG. 3 shows a schematic block level circuit diagram of a bandgap voltage reference circuit with both high-order temperature curvature compensation and low output impedance according to one embodiment of the present invention.

FIG. 3 shows a schematic block-level diagram of a bandgap voltage reference circuit with high-order temperature curvature compensation and low output impedance in accordance with one embodiment of the invention. The circuit comprises a "conventional bandgap circuit" made of two bipolar junction transistors $Q_1$ (301) and $Q_2$ (302), and the three resistors $R_1$ (303) and $R_2$ (i.e. (304) and (305)). The bandgap voltage reference circuit also comprises an operational amplifier (306), which may be optionally followed by a buffer (308), and a transconductance amplifier (307). The transconductance amplifier (307) produces three currents that have very low dependency on temperature variations. Two of the currents are used in the conventional bandgap circuit, while the third is used for a third bipolar junction transistor $Q_3$ (311). Transistor $Q_3$ (311) and the two $R_{NL}$ resistors (312) and (313) are used to cancel the non-linear temperature dependence of the CTAT currents flowing in the $R_2$ resistors (304) and (305) yielding an almost constant current and voltage reference with respect to temperature variations. This is necessary for high-precision applications, such as when temperature coefficients lower than 50 ppm/° C. are needed over a wide temperature range (e.g., from −25° C. to 125° C.). With the output voltage reference being the output of the operational amplifier, a low output impedance can be guaranteed at the output of the bandgap voltage reference circuit. Accordingly, the output of the circuit can support load or leakage currents or can provide an output current. The transconductance amplifier preferably should have a linear relationship between its input voltage and output current that has very small dependence on temperature.

The architecture in FIG. 3 can generate a reference output voltage $V_{REF}$ of any value independent of the silicon bandgap voltage. The reference voltage is equal to $$V_{REF} = \frac{I_o}{G_m},$$

where $I_o$ is the output current of the transconductance amplifier and $G_m$ is its transconductance gain. $I_o$ is equal to $I_{VEB}+I_{PTAT}+I_{NL}$, with $$I_{VEB} = \frac{V_{EB1}}{R_2}, I_{PTAT} = \frac{V_T \ln(N)}{R_1}, \text{ and } I_{NL} = \frac{V_{EB1} - V_{EB3}}{R_{NL}}.$$

$V_{EBi}$ is the emitter-base voltage of the bipolar junction transistor $Q_i$. $V_T$ is the thermal voltage that is equal to $$\frac{kT}{q}$$

with k being the Boltzmann's constant, T is the absolute temperature, and q is the electron charge. N is the ratio of the emitter area of the bipolar junction transistor $Q_2$ to that of $Q_1$. The reference voltage is thus given as $$V_{REF} = \frac{1}{G_m}\left(\frac{V_T \ln(N)}{R_1} + \frac{V_{EB1}}{R_2} + \frac{V_{EB1} - V_{EB3}}{R_{NL}}\right).$$

The emitter-base voltages can be written as $$V_{EB3} = V_{BG} - (V_{BG} - V_{EB0})\frac{T}{T_0} - \eta V_T \ln\left(\frac{T}{T_0}\right), \text{ and}$$

$$V_{EB1,2} = V_{BG} - (V_{BG} - V_{EB0})\frac{T}{T_0} - (\eta - 1)V_T \ln\left(\frac{T}{T_0}\right).$$

The difference in the equations for $V_{EB3}$ and $V_{EB1,2}$ results from the fact that the current in $Q_3$ is almost constant with temperature, whereas that in $Q_1$ and $Q_2$ is proportional to absolute temperature (PTAT). $\eta$ is a technology parameter that depends on the bipolar structure, $V_{EB0}$ is the emitter-base voltage at temperature $T_0$, and $V_{BG}$ is the silicon bandgap voltage. Choosing $$R_{NL} = \frac{R_2}{\eta - 1}$$

gives $$V_{REF} = \frac{1}{G_m}\left(\frac{V_T \ln(N)}{R_1} + \frac{V_{BG} - (V_{BG} - V_{EB0})\frac{T}{T_0}}{R_2}\right)$$

where the non-linear term in temperature is cancelled.

Figure 4:
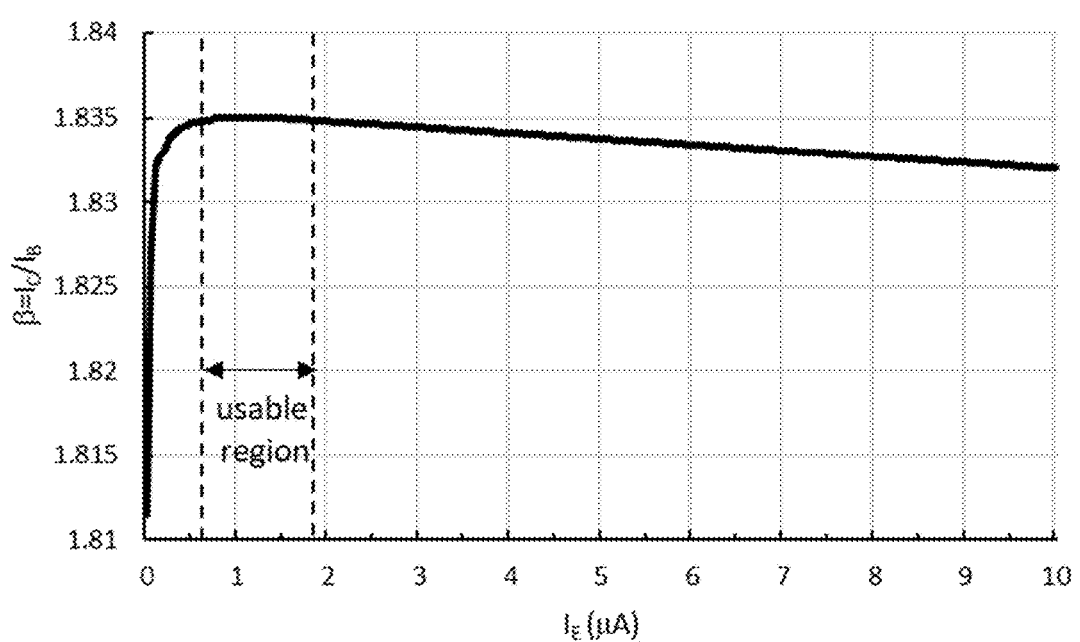
FIG. 4 shows an example Gummel plot of the bipolar junction transistor and a recommendation as to where to bias it according to one embodiment of the present invention.

From the above equation, $R_1$ may be chosen to determine the current flowing through the bipolar junction transistors and thus the overall power consumption. $R_1$ is usually chosen to make the current fall in the flat region of the bipolar junction transistor Gummel plot as shown in FIG. 4. In FIG. 4, an exemplary usable region is shown to span from around 0.7 µA to around 1.8 µA. However, depending on the applications, the usable region (i.e., the flat region) may be extend to beyond 2 µA, such as 3 µA or higher. $R_2$ may be used to adjust the output voltage curvature with respect to temperature variations and can be made programmable for curvature trimming. $G_m$ can be used to adjust the exact value of the output voltage reference and can also be made programmable for accuracy trimming.

Figure 5:
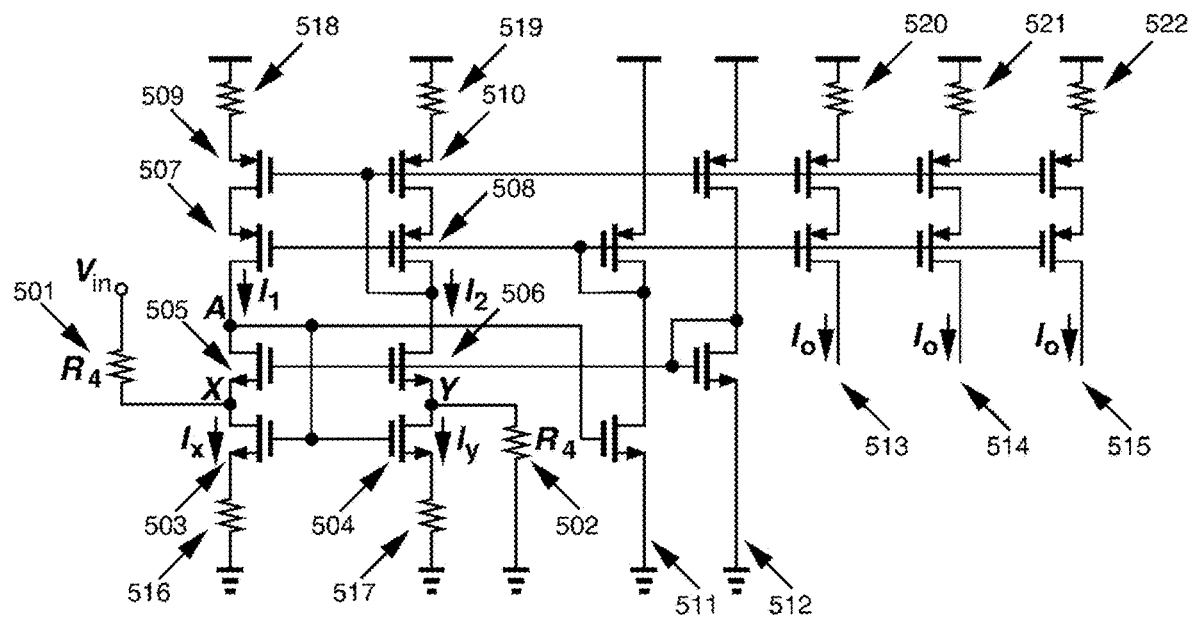
FIG. 5 shows an example circuit diagram of a transconductance amplifier, according to one embodiment of the present invention, that can be used in the bandgap voltage reference circuit of FIG. 3.

FIG. 5 shows a possible implementation of the transconductance amplifier (307) that may be used in the bandgap reference circuit of FIG. 3. The input voltage is applied across the resistors $R_4$ (i.e., (501) and (502)). These resistors should be matched with all the resistors in FIG. 3 in construction and the unit resistor used. The relative sizing of transistors (509) to (510) set the current ratio between $I_1$ and $I_2$. Making transistors (503) and (504) equal in size makes $I_x$ equal to $I_y$. Applying Kirchoff's current law at nodes X and Y can thus yield a relation of the currents $I_1$ and $I_2$ in terms of the input voltage and the resistors values. Branches (511) and (512) are used for biasing cascode transistors. Branches (513) and (514) generate the required currents for the bipolar junction transistors $Q_1$ (301) and $Q_2$ (302) and the resistors $R_1$ (303) and $R_2$ (i.e., (304) and (305)) of FIG. 3, while branch (515) generates the current for the bipolar junction transistor $Q_3$ (311) of FIG. 3 used for high-order temperature curvature compensation. The relative sizes of these branches can be used to set the final value of the transconductance gain. Degeneration resistors (516-522) are used to improve the matching of the current sources and reduce the input-referred offset voltage of the transconductance amplifier.

The transconductance gain of the transconductance amplifier shown in FIG. 5 is given by $$I_o = \frac{kV_{in}}{(N-1)R_4},$$

wherein k is the ratio of the sizes of the transistors in branches (513), (514), and (515) to transistors (507) and (509), and N is the ratio of the size of transistors (508) and (510) to transistors (507) and (509), respectively. With this implementation, the transconductance gain is inversely proportional to the value of $R_4$, which can be matched to the other resistors in the bandgap voltage reference circuit in construction and the unit resistor used. $R_4$ can then be used for accuracy trimming.

While FIG. 5 illustrates one implementation of a transconductance amplifier that can be used with embodiments of the invention, one skilled in the art would appreciate that this example is for illustration only and that other variations and modifications are possible without departing from the scope of the invention.

Figure 6:
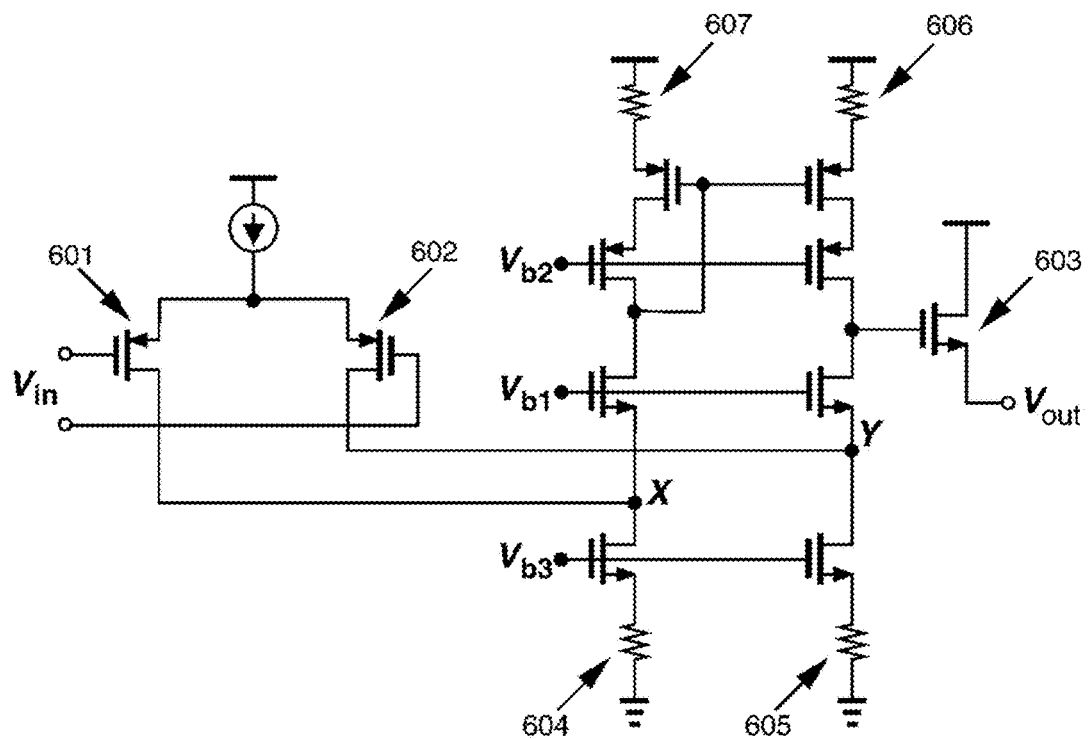
FIG. 6 shows an example circuit diagram of an operational amplifier, according to one embodiment of the present invention, that can be used in the bandgap voltage reference circuit of FIG. 3.

FIG. 6 shows a possible implementation of the operational amplifier (306) and the following buffer (308) used in the bandgap voltage reference circuit of FIG. 3. The operational amplifier (306) comprises a folded-cascode amplifier with a PMOS differential pair input (601) and (602). The buffer (308) may be implemented as a source follower (603). The folded-cascode amplifier provides the necessary gain for the operation of the bandgap voltage reference circuit and guarantees the required accuracy. The source follower (603) provides low impedance at the output node and can also provide any necessary load/leakage current. The degeneration resistors (604), (605), (606), and (607) are used to improve matching of current sources and thus reduce the input-referred offset voltage of the operational amplifier (306) in FIG. 3.

Figure 7:
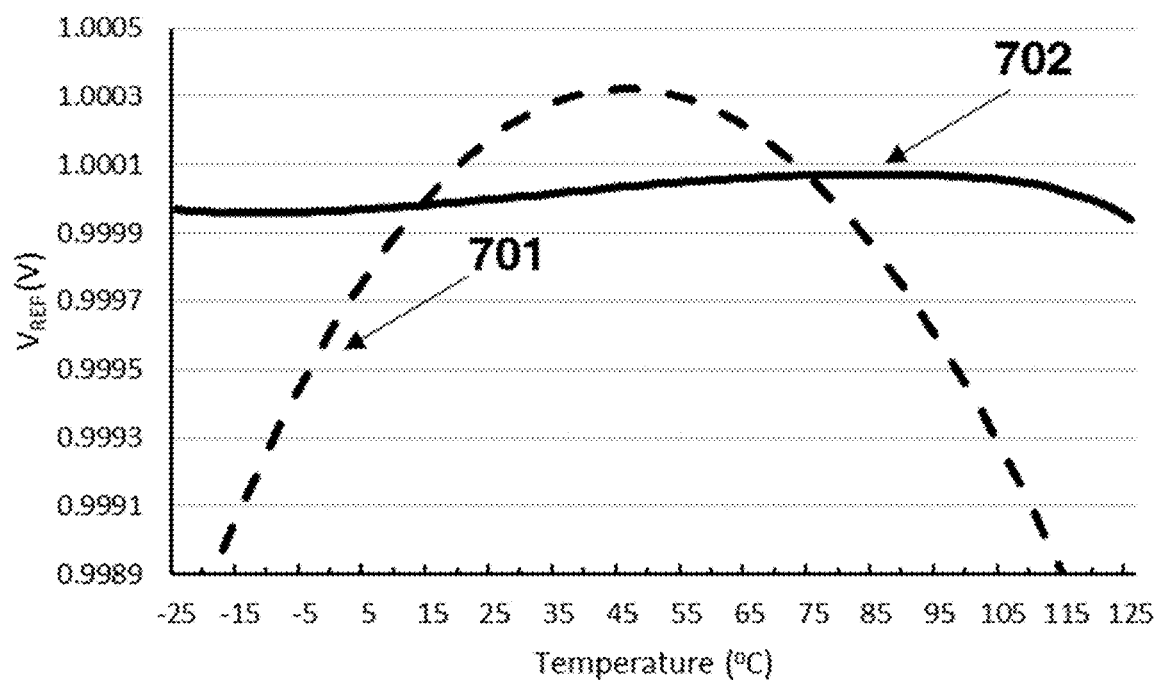
FIG. 7 shows the simulated output voltage of the bandgap voltage reference of FIG. 3 versus temperature.

While FIG. 6 illustrates one implementation of an operational amplifier followed by a buffer that can be used with embodiments of the invention, one skilled in the art would appreciate that this example is for illustration only and that other variations and modifications are possible without departing from the scope of the invention. For example, the operational amplifier can be implemented as a single or two-stage amplifier, a folded-cascode, or a telescope cascode amplifier. In addition, while the above example uses PMOS transistors to implement a folded-cascode amplifier, other implementations are possible, such as NMOS transistors, PMOS transistors, npn transistors, pnp transistors, FinFET transistors or a combination thereof. Another example is the buffer, which can also be implemented as another operation amplifier in a unity feedback configuration, or it can be implemented by a native NMOS device FIG. 7 shows the simulated output voltage of the bandgap voltage reference circuit of FIG. 3 as a function of temperature. Simulations are done while an output load current is being drawn out of the circuit. Plot (701) shows the output voltage when the bipolar junction transistor $Q_3$ (311) and resistors $R_{NL}$ (i.e., (312) and (313)) are not used. Without high-order temperature curvature compensation, a variation in the output voltage of about 2 mV is observed over a temperature range of −25° C. to 125° C. This may not be suitable for some high-precision applications. Plot (702) shows the same output voltage when the bipolar junction transistor $Q_3$ (311) and resistors $R_{NL}$ (i.e. (312) and (313)) are used. This enables the high-order temperature curvature compensation and as a result, a variation in the output voltage of only 200 µV is observed over the same temperature range of −25° C. to 125° C. This is better for high-precision applications.

Figure 8:
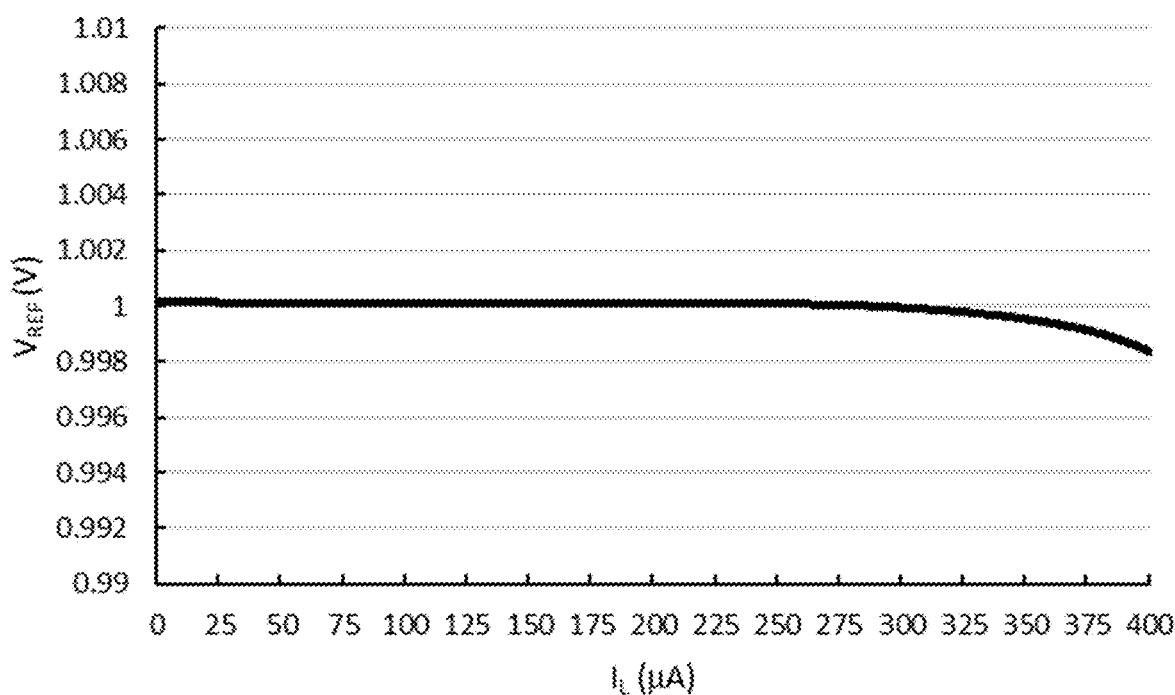
FIG. 8 shows the simulated output voltage of the bandgap voltage reference of FIG. 3 versus load current.

FIG. 8 shows a plot of the output voltage of the bandgap voltage reference circuit of FIG. 3 as a function of load/leakage current at room temperature with the vertical axis limited to only ±1% of the nominal reference voltage. As can be seen, the output voltage $V_{REF}$ only shows a total variation of 2 mV or 0.2% of the nominal reference voltage over load/leakage current variation of up to 400 µA. If more load/leakage current is to be expected, the size of the source follower can be adjusted accordingly.

The results shown in FIGS. 7 and 8 demonstrate that embodiments of the invention can provide accurate reference voltages that are insensitive to temperature variations and load/leakage current variations. Therefore, embodiments of the invention are suitable for high-precision applications. In addition, an output voltage of a bandgap reference circuit of the invention can be adjusted to be either above or below the silicon bandgap voltage (the golden voltage around 1.2 V) without impacting the temperature curvature.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A bandgap reference circuit, comprising:
a conventional bandgap circuit that comprises two bipolar junction transistors and three resistors;
an operational amplifier connected to the conventional bandgap circuit;
a transconductance amplifier connected to the conventional bandgap circuit;
a circuit for high-order temperature curvature compensation; and
a circuit for low output impedance and current drive capability,
wherein a current of the transconductance and a gain of the transconductance determine an output voltage of the bandgap reference circuit, which can be independently adjusted to be either above or below a silicon bandgap voltage without impacting temperature curvature.

2. A bandgap reference circuit, comprising:
a conventional bandgap circuit that comprises two bipolar junction transistors and three resistors having a first input, a second input, and a first output connected to ground;
an operational amplifier having a third input connected to the first input of the conventional bandgap circuit, a fourth input connected to the second input of the conventional bandgap circuit, and a second output;
a buffer circuit having a fifth input connected to the second output of the operational amplifier, and a third output;
a temperature curvature compensation circuit comprising a third bipolar junction transistor and two resistors having a sixth input connected to the first input of the conventional bandgap circuit, a seventh input connected to the second input of the conventional bandgap circuit, an eighth input, and a fourth output connected to ground; and
a transconductance amplifier having a ninth input connected to the third output of the buffer circuit, a tenth input connected to ground, a fifth output connected to the first input of the conventional bandgap circuit, a sixth output connected to the second input of the conventional bandgap circuit, and a seventh output connected to the eighth input of the temperature compensation circuit.

3. The bandgap reference circuit of claim 2, wherein the operational amplifier is implemented as a single or two-stage amplifier, a folded-cascode, or a telescope cascode amplifier.

4. The bandgap reference circuit of claim 2, wherein the operational amplifier is implemented with degeneration resistors in current sources to reduce an input-referred offset voltage.

5. The bandgap reference circuit of claim 2, wherein the operational amplifier has a low output impedance.

6. The bandgap reference circuit of claim 2, wherein the operational amplifier has an input pair comprising an NMOS transistor, a PMOS transistor, an npn transistor, a pnp transistor, a FinFET transistor, or a combination thereof.

7. The bandgap reference circuit of claim 2, wherein the two bipolar junction transistors comprise an npn or a pnp transistor.

8. The bandgap reference circuit of claim 2, wherein the resistors comprise a silicided poly resistor, an unsilicided poly resistor, a diffusion resistor, a well resistor or a combination thereof.

9. The bandgap reference circuit of claim 2, wherein the conventional bandgap circuit is directly connected to the operational amplifier or through a resistor divider, wherein one end of the resistor divider is connected to ground and one end is connected to the conventional bandgap circuit output, wherein an output of the resistor divider is connected to the operational amplifier input.

10. The bandgap reference circuit of claim 2, wherein the transconductance amplifier converts a reference voltage to three separate currents.

11. The bandgap reference circuit of claim 2, wherein the transconductance amplifier is implemented with degeneration resistors in current sources to reduce an input-referred offset voltage.

12. The bandgap reference circuit of claim 2, wherein the buffer can be implemented as a native NMOS transistor, wherein a gate of the NMOS transistor is connected to the output of the operational amplifier.

* * * * *